(12) United States Patent
Yan et al.

(10) Patent No.: US 11,869,976 B2
(45) Date of Patent: Jan. 9, 2024

(54) THIN FILM TRANSISTOR AND MANUFACTURING METHOD THEREFOR, ARRAY SUBSTRATE, AND DISPLAY DEVICE

(71) Applicants: ORDOS YUANSHENG OPTOELECTRONICS CO., LTD., Inner Mongolia (CN); BOE TECHNOLOGY GROUP CO., LTD., Beijing (CN)

(72) Inventors: Lei Yan, Beijing (CN); Jun Fan, Beijing (CN); Yezhou Fang, Beijing (CN); Feng Li, Beijing (CN); Wei Li, Beijing (CN); Lei Li, Beijing (CN); Yusheng Liu, Beijing (CN); Yanyan Meng, Beijing (CN)

(73) Assignees: ORDOS YUANSHENG OPTOELECTRONICS CO., LTD., Inner Mongolia (CN); BOE TECHNOLOGY GROUP CO., LTD., Beijing (CN)

(*) Notice: Subject to any disclaimer, the term of this patent is extended or adjusted under 35 U.S.C. 154(b) by 332 days.

(21) Appl. No.: 17/289,200

(22) PCT Filed: Aug. 25, 2020

(86) PCT No.: PCT/CN2020/111020
§ 371 (c)(1),
(2) Date: Apr. 27, 2021

(87) PCT Pub. No.: WO2021/073253
PCT Pub. Date: Apr. 22, 2021

(65) Prior Publication Data
US 2021/0367081 A1    Nov. 25, 2021

(30) Foreign Application Priority Data
Oct. 18, 2019    (CN) .......................... 201910994876.5

(51) Int. Cl.
*H01L 29/786* (2006.01)
*H01L 27/12* (2006.01)
(Continued)

(52) U.S. Cl.
CPC .... *H01L 29/78645* (2013.01); *H01L 27/1222* (2013.01); *H01L 29/41733* (2013.01);
(Continued)

(58) Field of Classification Search
CPC ........... H01L 29/78645; H01L 27/1222; H01L 29/41733; H01L 29/66757;
(Continued)

(56) References Cited

U.S. PATENT DOCUMENTS 7,118,944 B2   10/2006  Chung
8,541,811 B2    9/2013  Jung et al.
(Continued)

FOREIGN PATENT DOCUMENTS

CN    1452250 A    10/2003
CN    1897309 A     1/2007
(Continued)

OTHER PUBLICATIONS

First Chinese Office Action dated Apr. 2, 2021; Appln. No. 201910994876.5.

*Primary Examiner* — Mohammed R Alam

(57) ABSTRACT

A thin film transistor and a manufacturing method therefor, an array substrate, and a display device. The thin film transistor includes an active layer, a gate insulating layer, and a gate electrode; the gate insulating layer is located on one side of the active layer; the gate electrode is located on one side of the gate insulating layer distant from the active layer; the gate electrode includes an opening a part of the active layer overlapped with the opening includes a first lightly doped region, a first heavily doped region, and a
(Continued)

second lightly doped region that are sequentially arranged along a first direction parallel to a plane where the active layer is located.

15 Claims, 5 Drawing Sheets

(51) Int. Cl.
*H01L 29/417* (2006.01)
*H01L 29/66* (2006.01)

(52) U.S. Cl.
CPC .. *H01L 29/66757* (2013.01); *H01L 29/78621* (2013.01); *H01L 29/78675* (2013.01); *H01L 29/78696* (2013.01)

(58) Field of Classification Search
CPC ......... H01L 29/78621; H01L 29/78675; H01L 29/78696; H01L 29/42384; H01L 29/78; H01L 27/1214; H01L 29/0607; G02F 1/1368; G02F 1/13685; H10K 59/12
See application file for complete search history.

(56) References Cited

U.S. PATENT DOCUMENTS

| | | | |
|---|---|---|---|
| 10,038,074 | B2 | 7/2018 | Chi |
| 2013/0328053 | A1 | 12/2013 | Roudbari et al. |
| 2017/0110528 | A1 | 4/2017 | Kim et al. |
| 2019/0131318 | A1* | 5/2019 | Xue .................. G02F 1/134309 |

FOREIGN PATENT DOCUMENTS

| | | | | |
|---|---|---|---|---|
| CN | 101021658 | A | | 8/2007 |
| CN | 101304047 | A | | 11/2008 |
| CN | 105390551 | A | * | 3/2016 ............ H01L 29/24 |
| CN | 105390551 | A | | 3/2016 |
| CN | 105742294 | A | | 7/2016 |
| CN | 206628473 | U | | 11/2017 |
| CN | 110649101 | A | | 1/2020 |
| JP | 2001284594 | A | | 10/2001 |

* cited by examiner

THIN FILM TRANSISTOR AND MANUFACTURING METHOD THEREFOR, ARRAY SUBSTRATE, AND DISPLAY DEVICE

TECHNICAL FIELD

Embodiments of the present disclosure relate to a thin film transistor, a manufacturing method thereof, an array substrate and a display device.

BACKGROUND

The thin film transistor (TFT) is a kind of thin film semiconductor element, which is widely used in fields such as display technology, integrated circuit technology, etc. In a liquid crystal display (LCD) or an organic light emitting diode (OLED) display, each pixel unit is driven by a TFT integrated in the pixel unit, so that picture information can be displayed at high speed, high brightness and high contrast.

Generally, according to the composition of the semiconductor film layer of the TFT, TFTs can be divided into amorphous silicon TFTs, poly-silicon TFTs and oxide TFTs. The electron mobility of poly-silicon TFT can reach 50-200 $cm^2/V \cdot s$, so poly-silicon TFT-LCD has the advantages of higher resolution, faster reaction speed and higher aperture ratio, etc.

However, because of the orderly lattice arrangement of poly-silicon TFT, the resistance of electrons in it is small, which leads to a large leakage current in the off state. The excessive leakage current will cause the pixel unit to fail to turn off, thus resulting in poor display and affecting the normal use of poly-silicon TFT. In order to reduce the leakage current of TFT, the method of modifying TFT structure design (for example, increasing the length of the channel region) can be adopted, the method of lightly doping between source and drain of TFT can also be adopted, and both of the methods can reduce the leakage current of poly-silicon TFT.

SUMMARY

One embodiment of the present disclosure provides a thin film transistor, including: an active layer; a gate insulating layer at one side of the active layer; a gate electrode at one side of the gate insulating layer away from the active layer, wherein the gate electrode includes an opening, and a part of the active layer overlapped with the opening includes a first lightly doped region, a first heavily doped region and a second lightly doped region which are sequentially arranged in a first direction parallel to a plane where the active layer is located.

In some examples, in the first direction, parts of the active layer located at two sides of the gate electrode and adjacent to the gate electrode respectively include a third lightly doped region and a fourth lightly doped region, and further includes a second heavily doped region at one side of the third lightly doped region away from the gate electrode and a third heavily doped region at one side of the fourth lightly doped region away from the gate electrode, the second heavily doped region and the third heavily doped region are respectively a source region and a drain region of the thin film transistor.

In some examples, the thin film transistor further includes a source electrode and a drain electrode, respectively electrically connected to the source region and the drain region.

In some examples, the first lightly doped region, the second lightly doped region, the third lightly doped region, the fourth lightly doped region, the first heavily doped region, the second heavily doped region and the third heavily doped region have a same doping type.

In some examples, a doping concentration of each of the first heavily doped region, the second heavily doped region and the third heavily doped region is 4-25 times a doping concentration of each of the first lightly doped region, the second lightly doped region, the third lightly doped region and the fourth lightly doped region.

In some examples, a part of the active layer overlapped with the gate electrode is a channel region, and a doping type of the channel region is opposite to the doping type of the first lightly doped region.

In some examples, the channel region includes a first channel region and a second channel region at two sides of the opening in the first direction; and in the first direction, the second heavily doped region, the third lightly doped region, the first channel region, the first lightly doped region, the first heavily doped region, the second lightly doped region, the second channel region, the fourth lightly doped region and the third heavily doped region are sequentially connected.

In some examples, the opening includes a first end portion and a second end portion in a second direction perpendicular to the first direction, the active layer includes a first edge and a second edge in the second direction, the first edge is at one side of the active layer close to the first end portion, the second edge is at one side of the active layer close to the second end portion, the first edge is aligned with the first edge or located at an outer side of the first edge, and the second end portion is aligned with the second edge or located at an outer side of the second edge.

In some examples, the gate electrode has a stripe shape extending in the second direction.

In some examples, the active layer is a low-temperature poly-silicon semiconductor layer.

One embodiment of the present disclosure further provides an array substrate, including the thin film transistor according to any one of the above.

One embodiment of the present disclosure further provides a display device, including the array substrate above-mentioned.

One embodiment of the present disclosure further provides a manufacturing method of a thin film transistor, including: forming an active layer; forming a gate insulating layer on the active layer; forming a gate electrode on one side of the gate insulating layer away from the active layer, and forming an opening in the gate electrode; and performing a doping process on the active layer to form a first lightly doped region, a first heavily doped region and a second lightly doped region, which are sequentially arranged in a direction parallel to a plane where the active layer is located, in a part of the active layer overlapped with the opening.

In some examples, performing a doping process on the active layer includes: performing a first doping process on the active layer by taking the gate electrode including the opening as a first mask; and forming a second mask at positions where the first lightly doped region and the second lightly doped region are formed on the active layer, and performing a second doping process, wherein a doping concentration of the first doping process is lower than a doping concentration of the second doping process, so as to form the first lightly doped region, the second lightly doped region and the first heavily doped region.

In some examples, upon performing the first doping process on the active layer by taking the gate electrode including the opening as the first mask, a third lightly doped region and a fourth lightly doped region are further formed, wherein the third lightly doped region and the fourth lightly doped region are respectively at two sides of the gate electrode in the direction and adjacent to the gate electrode; the second mask is also located at the third lightly doped region and the fourth lightly doped region, and upon forming the first heavily doped region, a second heavily doped region is formed at one side of the third lightly doped region away from the gate electrode, and a third heavily doped region is formed at one side of the fourth lightly doped region away from the gate electrode.

In some examples, the method further includes: performing a third doping process on the active layer before the first doping process, wherein a doping type of the third doping process is opposite to doping types of the first doping process and the second doping process.

BRIEF DESCRIPTION OF THE DRAWINGS

In order to clearly illustrate the technical solutions of the embodiments of the disclosure, the drawings of the embodiments will be briefly described in the following; it is obvious that the described drawings are only related to some embodiments of the disclosure and thus are not limitative to the disclosure.

DETAILED DESCRIPTION

In order to make objects, technical details and advantages of the embodiments of the present disclosure apparent, the technical solutions of the embodiment will be described in a clearly and fully understandable way in connection with the drawings related to the embodiments of the present disclosure. It is obvious that the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "Upper", "lower", "left", "right", etc. are only used to indicate the relative positional relationship, and when the absolute position of the object to be described is changed, the relative positional relationship may also change accordingly.

Figure 1:
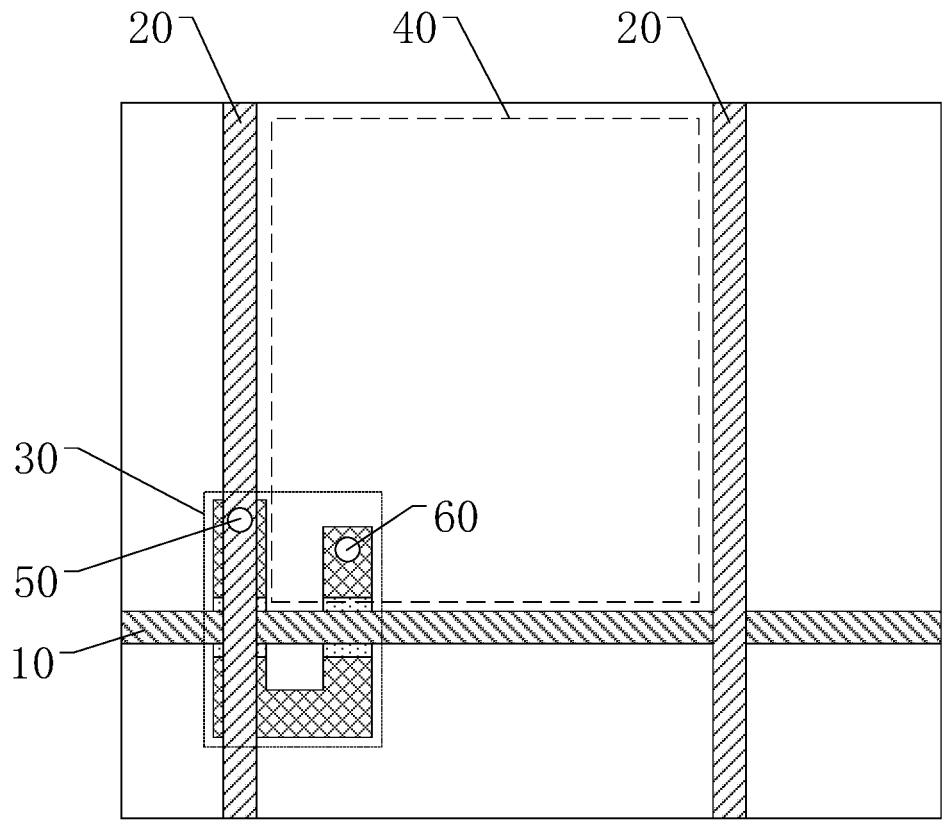
FIG. 1 is a schematic structural diagram of a pixel unit including a thin film transistor with a U-shaped dual-gate structure.
Figure 2:
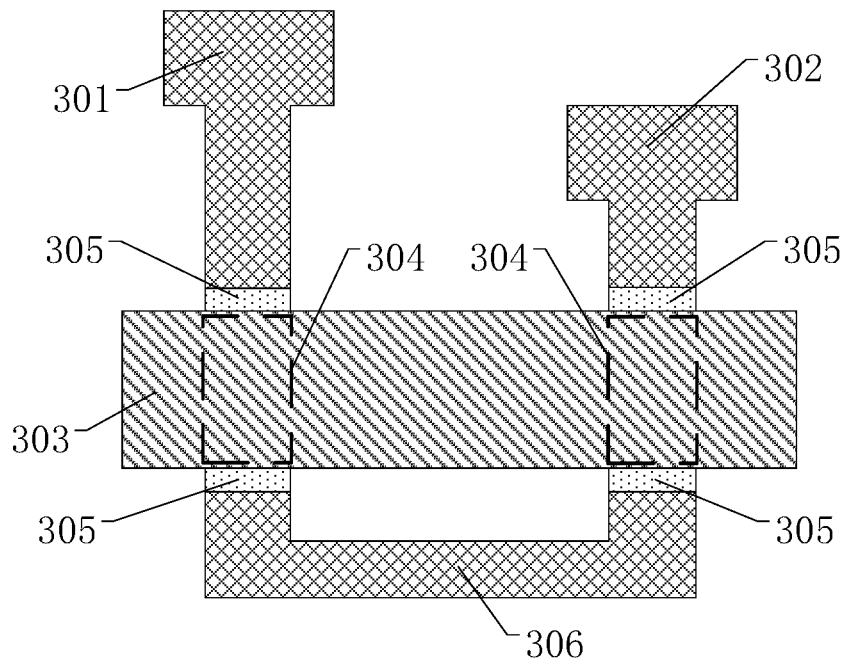
FIG. 2 is a schematic diagram of the U-shaped dual-gate structure of the thin film transistor illustrated in FIG. 1.

In a low-temperature poly-silicon (LTPS) thin film transistor liquid crystal display or an organic light emitting diode display, when the thin film transistor is used as a control switch of the pixel unit, the U-shaped dual-gate structure is a common design. FIG. 1 is a schematic plane view of a pixel unit including a thin film transistor with a U-shaped dual-gate structure, and FIG. 2 is a schematic plane view of the U-shaped dual-gate structure of the thin film transistor illustrated in FIG. 1. As illustrated in FIG. 1, the pixel unit includes a gate line 10, a data line 20, a thin film transistor 30 and a pixel electrode 40. The thin film transistor 30 is electrically connected to the gate line 10, the data line 20, and the pixel electrode 40, respectively. The thin film transistor 30 is designed with a U-shaped dual-gate structure. As illustrated in FIG. 2, the thin film transistor 30 with the U-shaped dual-gate structure includes an active layer and a gate electrode 303. As can be viewed from FIG. 2, the gate electrode 303 is partially overlapped with the active layer in the direction perpendicular to the surface of the paper. The active layer is approximately U-shaped and includes a source region 301, a drain region 302, a channel region 304, a lightly doped region 305 and a heavily doped region 306. The source region 301 and the drain region 302 are respectively located at the two ends of the U-shape. The connection mode of the U-shaped dual-gate thin film transistor 30 in the pixel unit is, for example, as illustrated in FIG. 1. The source region 301 is partially overlapped with the data line 20 and is connected to the data line 20 through a first via hole 50. The drain region 302 is connected to the pixel electrode 40 through a second via hole 60. That is, the thin film transistor directly uses a part of the gate line 10 as the gate electrode 303. This connection mode of the thin film transistor in the pixel unit is conducive to saving space and improving aperture ratio of the pixel. The part of the active layer overlapped with the gate electrode 303 is the channel region 304, and the number of the channel regions 304 is two. The active layer located at the two sides of each channel region 304 and adjacent to the channel region includes two lightly doped regions 305, and a heavily doped region 306 is located at one side of the gate electrode 303 away from the source region 301 and the drain region 302, and each end of the heavily doped regions 306 is respectively connected to one lightly doped region 305. For example, the doping concentration and doping type of the source region 301 and those of the drain region 302 are the same as those of the heavily doped region 306. The U-shaped dual-gate structure increases the length of the channel region and adds lightly doped regions at the two sides of the channel region, thereby effectively reducing leakage current.

However, the application of the U-shaped dual-gate TFT is limited by pixels per inch (PPI). For example, in the case where PPI is low, the area of a single pixel unit is large, and there is enough space for the thin film transistor to have a U-shaped dual-gate structure design as illustrated in FIG. 1 and FIG. 2. However, for example, in the case where PPI is greater than 800, the area of a single pixel unit is small, and the design space of the thin film transistor can no longer allow the use of the U-shaped dual-gate structure, and only single-gate structure can be adopted.

Figure 3:
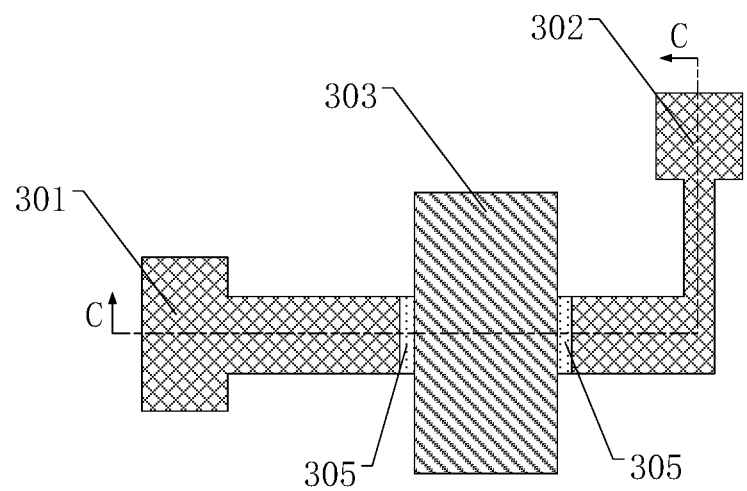
FIG. 3 is a schematic diagram of an L-shaped single-gate structure of a thin film transistor.
Figure 4:
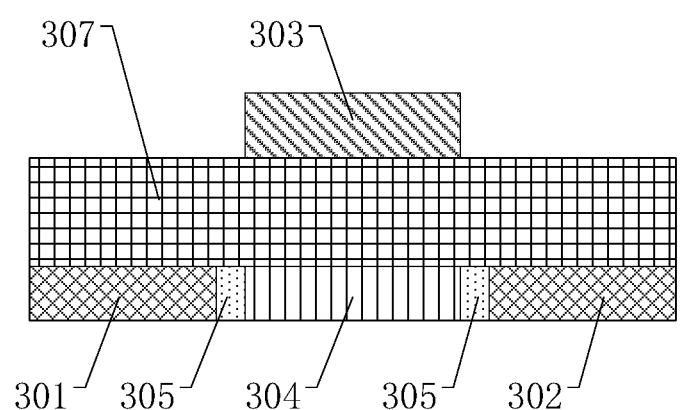
FIG. 4 is a schematic cross-sectional view of the thin film transistor illustrated in FIG. 3 taken along line C-C.

FIG. 3 is a schematic diagram of an L-shaped single-gate structure of a thin film transistor, and FIG. 4 is a schematic cross-sectional view of the thin film transistor illustrated in FIG. 3 taken along line C-C. As illustrated in FIG. 3 and FIG. 4, the thin film transistor with the L-shaped single-gate structure includes an active layer, a gate electrode 303, and a gate insulating layer 307. The gate insulating layer 307 is located between the active layer and the gate electrode 303. As illustrated in FIG. 3, the gate electrode 303 is partially overlapped with the active layer in the direction perpendicular to the surface of the paper. The active layer is L-shaped and includes a source region 301, a drain region 302, a channel region 304 and a lightly doped region 305. The source region 301 and the drain region 302 are located at the two ends of the active layer, respectively. The part of the active layer overlapped with the gate electrode 303 is a channel region 304. The active layer located at the two sides of the channel region 304 and adjacent to the channel region includes two lightly doped regions 305.

Compared with the U-shaped dual-gate structure, the L-shaped single-gate structure reduces the length of the channel region and the number of lightly doped regions, so the leakage current will greatly increase. Therefore, when designing the thin film transistor structure, if the U-shaped dual-gate structure in FIG. 1 is directly replaced with the L-shaped single-gate structure in order to improve the pixels per inch, the leakage current of the thin film transistor will be greatly increased, so that the thin film transistor will be difficult to turn off, and the pixel unit will be in a bright state under the influence of leakage current, resulting in poor display of products.

Embodiments of the present disclosure provide a thin film transistor, a manufacturing method thereof, an array substrate and a display device. The thin film transistor includes an active layer, a gate insulating layer, and a gate electrode. The gate insulating layer is located at one side of the active layer. The gate electrode is located at one side of the gate insulating layer away from the active layer. The gate electrode includes an opening, and the part of the active layer overlapped with the opening includes a first lightly doped region, a first heavily doped region and a second lightly doped region which are sequentially arranged along a first direction parallel to the plane where the active layer is located. The thin film transistor can greatly reduce leakage current, and can be used for a display with high pixels per inch.

Hereinafter, the embodiments of the present disclosure will be described in detail with reference to the accompanying drawings. It should be noted that the same reference numerals in different drawings are used to refer to the same elements already described.

Figure 5:
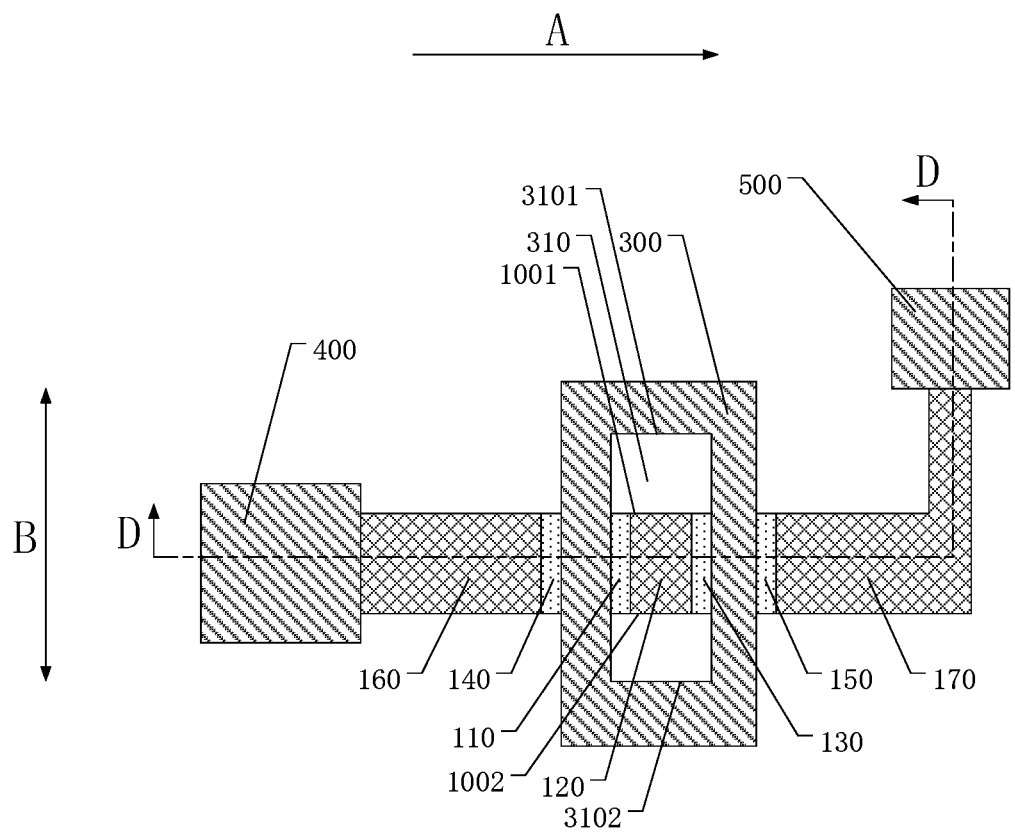
FIG. 5 is a schematic structural diagram of a thin film transistor according to an embodiment of the present disclosure.
Figure 6:
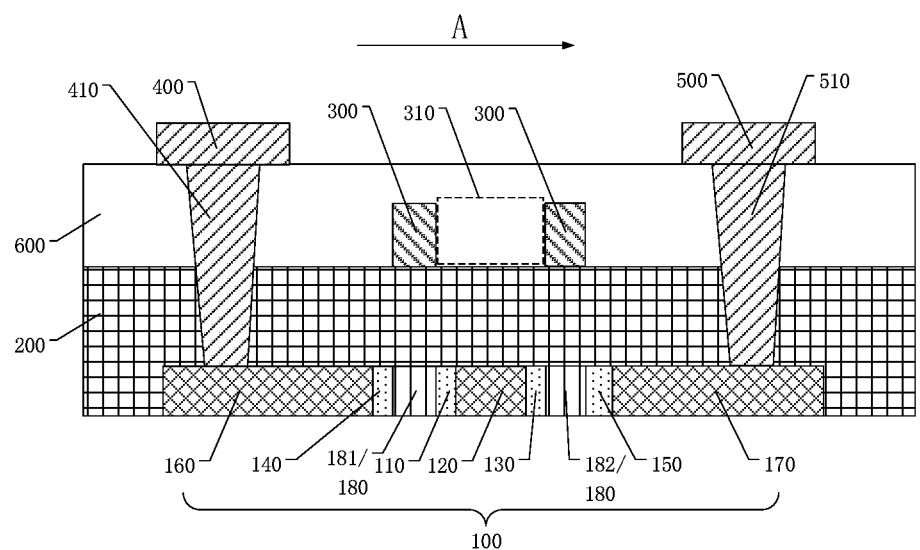
FIG. 6 is a schematic cross-sectional view of the thin film transistor illustrated in FIG. 5 taken along line D-D.

FIG. 5 is a schematic structural diagram of a thin film transistor according to an embodiment of the present disclosure, and FIG. 6 is a schematic cross-sectional view of the thin film transistor illustrated in FIG. 5 taken along line D-D. As illustrated in FIG. 5 and FIG. 6, the thin film transistor includes an active layer 100, a gate insulating layer 200, and a gate electrode 300. The gate insulating layer 200 is located at one side of the active layer 100 (for example, as illustrated in FIG. 6, located at the upper side of the active layer 100) and covers the active layer 100. The gate electrode 300 is located at one side of the gate insulating layer 200 away from the active layer 100. The gate electrode 300 includes an opening 310, the opening 310 penetrates through the gate electrode layer, and the part of the active layer 100 overlapped with the opening 310 includes a first lightly doped region 110, a first heavily doped region 120, and a second lightly doped region 130 which are sequentially arranged along the first direction A. For example, the first direction A is a direction parallel to the plane where the active layer is located. For example, here, the active layer being overlapped with the opening means being overlapped in the direction perpendicular to the active layer (in the thickness direction of the active layer).

In the thin film transistor provided by the present embodiment, the active layer overlapped with the opening includes a first lightly doped region, a first heavily doped region and a second lightly doped region which are sequentially arranged. The first lightly doped region and the second lightly doped region can reduce the electric field of the active layer along the first direction and reduce the hot carriers generated by collision ionization which is caused by the acceleration of the electric field, thereby effectively reducing the leakage current. In addition, the overlapping area between the gate electrode and the active layer can be reduced by setting the opening, so that the parasitic capacitance is reduced, and the anti-crosstalk and anti-flicker levels of the display using the thin film transistor are improved.

For example, as illustrated in FIG. 5 and FIG. 6, the active layer 100 further includes a third lightly doped region 140, a fourth lightly doped region 150, a second heavily doped region 160 and a third heavily doped region 170. The third lightly doped region 140 and the fourth lightly doped region 150 are parts of the active layer 100 located at the two sides of the gate electrode 300 and adjacent to the gate electrode 300, respectively. The second heavily doped region 160 is located at one side of the third lightly doped region 140 away from the gate electrode 300, the third heavily doped region 170 is located at one side of the fourth lightly doped region 150 away from the gate electrode 300, and the second heavily doped region 160 and the third heavily doped region 170 are respectively the source region 160 and the drain region 170 of the thin film transistor. The third lightly doped region 140 and the fourth lightly doped region 150 can further reduce the electric field of the active layer along the first direction and reduce hot carriers, thereby further reducing leakage current.

The length (size in the first direction A) and doping concentration of the lightly doped region can be designed according to the condition of the leakage current. For example, the length of the lightly doped region can be adjusted, so that the thin film transistor can achieve the effect of suppressing leakage current without increasing the on-state current significantly, thus not increasing the power consumption of the element significantly. For example, the lengths of the first lightly doped region 110, the second lightly doped region 130, the third lightly doped region 140 and the fourth lightly doped region 150 are all in the range of 0.5 μm to 1.5 μm.

For example, by adjusting the doping concentration of lightly doping, the thin film transistor can achieve the effect of suppressing leakage current without increasing the on-state current significantly, thus not increasing the power consumption of the element significantly. For example, the doping concentrations of the first lightly doped region 110, the second lightly doped region 130, the third lightly doped region 140 and the fourth lightly doped region 150 are in the range of $2 \times 10^{13}$-$5 \times 10^{13}$ cm$^{-3}$, and the doping concentrations of the first heavily doped region 120, the second heavily doped region 160 and the third heavily doped region 170 are in the range of $2 \times 10^{14}$-$5 \times 10^{14}$ cm$^{-3}$.

For example, the doping concentration of each heavily doped region is 4-25 times the doping concentration of each lightly doped region.

For example, as illustrated in FIG. 5 and FIG. 6, the thin film transistor further includes an interlayer insulating layer 600, which is located at one side of the gate electrode 300 away from the active layer 100 and covers the gate electrode 300.

For example, as illustrated in FIG. 5 and FIG. 6, the thin film transistor further includes a source electrode 400 and a drain electrode 500. A first via hole 410 and a second via hole 510 are provided in the interlayer insulating layer 600 and the gate insulating layer 200. The first via hole 410 passes through the gate insulating layer 200 and the interlayer insulating layer 600, so that the source electrode 400 is electrically connected to the source region 160 through the first via hole 410. The second via hole 510 passes through the gate insulating layer 200 and the interlayer insulating layer 600, so that the drain electrode 500 is electrically connected to the drain region 170 through the second via hole 510.

For example, the doping types of the first lightly doped region 110, the second lightly doped region 130, the third lightly doped region 140, the fourth lightly doped region 150, the first heavily doped region 120, the second heavily doped region 160 and the third heavily doped region 170 are the same, and for example, can be N-type doping or P-type doping.

For example, as illustrated in FIG. 5 and FIG. 6, the part of the active layer 100 overlapped with the gate electrode 300 is a channel region 180. For example, the doping type of the channel region 180 is opposite to the doping type of the first lightly doped region 110. For example, the doping concentration of the channel region 180 is $4 \times 10^{22}$-$7 \times 10^{12}$ cm$^{-3}$.

For example, the doping concentration of the lightly doped region is greater than the doping concentration of the channel region. For example, the doping concentration of the lightly doped region can be 3-12 times the doping concentration of the channel region. Although the channel region is slightly doped, the channel region of the active layer still maintains semiconductor characteristics, thus realizing the related functions of the thin film transistor.

For example, the first lightly doped region 110, the second lightly doped region 130, the third lightly doped region 140, the fourth lightly doped region 150, the first heavily doped region 120, the second heavily doped region 160 and the third heavily doped region 170 are N-type doped, and the channel region 180 is P-type doped. However, the present embodiment is not limited to this case, and the channel region 180 can be N-type doped, and correspondingly the first lightly doped region 110, the second lightly doped region 130, the third lightly doped region 140, the fourth lightly doped region 150, the first heavily doped region 120, the second heavily doped region 160 and the third heavily doped region 170 are P-type doped.

In some examples, as illustrated in FIG. 6, the channel region 180 includes a first channel region 181 and a second channel region 182 located at the two sides of the opening 310 along the first direction A. In the first direction A, the second heavily doped region 160, the third lightly doped region 140, the first channel region 181, the first lightly doped region 110, the first heavily doped region 120, the second lightly doped region 130, the second channel region 182, the fourth lightly doped region 150 and the third heavily doped region 170 are sequentially connected.

The ion doping type of the channel region 180 is opposite to that of the first lightly doped region 110, therefore, in the thin film transistor provided in the above example, four PN junctions are formed in the active layer 100 along the first direction, and the four PN junctions are respectively located between the third lightly doped region 140 and the first channel region 181, between the first channel region 181 and the first lightly doped region 110, between the second lightly doped region 130 and the second channel region 182, and between the second channel region 182 and the fourth lightly doped region 150. Because the PN junction has the characteristics of forward turn-on and reverse turn-off, the formed PN junctions can further reduce the leakage current.

In some examples, as illustrated in FIG. 5, the opening 310 includes a first end portion 3101 and a second end portion 3102, and the first end portion 3101 and the second end portion 3102 are respectively located at the two ends of the opening 310 along a second direction B perpendicular to the first direction A. For example, the second direction B is also parallel to the plane where the active layer is located. The active layer 100 includes a first edge 1001 and a second edge 1002, and the first edge 1001 and the second edge 1002 are respectively located at the two sides of the active layer 100 in the second direction B. The first end portion 3101 extends beyond the first edge 1001, and the second end portion 3102 extends beyond the second edge 1002. Alternatively, the first end portion 3101 is aligned with the first edge 1001, and the second end portion 3102 is aligned with the second edge 1002. Alternatively, the first end portion 3101 extends beyond the first edge 1001, and the second end portion 3102 is aligned with the second edge 1001. Alternatively, the first end portion 3101 is aligned with the first edge 1001, and the second end portion 3102 extends beyond the second edge 1002. The above four arrangement modes of the opening 310 can make the first lightly doped region 110 and the second lightly doped region 130 respectively doped to the first edge 1001 and the second edge 1002 along the second direction B, which is beneficial to isolate the two channel regions 181 and 182 when the thin film transistor is in the off state, thereby further reducing the leakage current.

For example, as illustrated in FIG. 5, the gate electrode 300 has a strip shape extending along the second direction B, and the opening 310 of the gate electrode also has a strip shape extending along the second direction B. In this way, the shape of the gate electrode 300 is similar to a rectangular-ambulatory-plane shape. For example, the strip shape of the opening 310 can be a polygon, such as a rectangle, a hexagon, etc., or can be an approximately oval shape, which is not limited in the present disclosure. For example, in the case where the thin film transistor is applied to an array substrate, the gate electrode 300 can be a part of the gate line, and the extending direction of the gate electrode 300 is the same as that of the gate line; or the gate electrode 300 is a part protruding from one side edge of the gate line.

In some examples, the active layer 100 is a low-temperature poly-silicon semiconductor layer, and the thin film transistor is a low-temperature poly-silicon thin film transistor.

An embodiment of the present disclosure further provides an array substrate, which includes the thin film transistor provided by any one of the above embodiments. For example, the array substrate can include, but is not limited to, an array substrate used for a liquid crystal display panel or an array substrate used for an OLED display, and the thin film transistor can be used as a switching transistor or a driving transistor. Other elements, such as gate lines, data lines, pixel electrodes, etc., can be included on the array substrate, and these elements can be connected to the thin film transistors according to the connection relationship in related technologies or arranged according to the positional relationship in related technologies. A single-gate structure is adopted in the embodiments of the present disclosure, therefore, the area occupied by the thin film transistor can be reduced, thereby further reducing the area of the pixel unit and improving the pixels per inch. Meanwhile, a plurality of lightly doped regions are formed due to the adoption of the gate electrode structure with the opening, and the problem of leakage current of the single-gate structure is alleviated at the same time. Other technical effects of the array substrate are the same as those of the above-mentioned thin film transistor, and will not be redundantly described here.

It should be noted that although the L-shaped active layer pattern was described as an example in the above embodiments, the embodiments of the present disclosure are not limited to this case. For example, the active layer can have an elongated structure extending along the first direction A described above. Although the above embodiments have been described taking the top-gate type as an example, the embodiments of the present disclosure are not limited to this case. For example, the gate electrode can also be located under the active layer to form a bottom-gate type thin film transistor. Although the source and drain electrodes are connected to the source and drain regions through via holes passing through the interlayer insulating layer in the above embodiments, the source and drain electrodes can be connected to the source and drain regions in other ways. For example, the source and drain electrodes can be formed under the active layer to be directly connected to the source and drain regions.

An embodiment of the present disclosure further provides a display device, which includes the array substrate provided by the above embodiment. For example, the display device can be implemented as any product or component with display function, such as a liquid crystal panel, an electronic paper, an organic light emitting diode (OLED) panel, a mobile phone, a tablet computer, a television, a display, a notebook computer, a digital photo frame, a navigator, etc. The display device has the same technical effects as the thin film transistor described above, which will not be redundantly described here.

Figure 7:
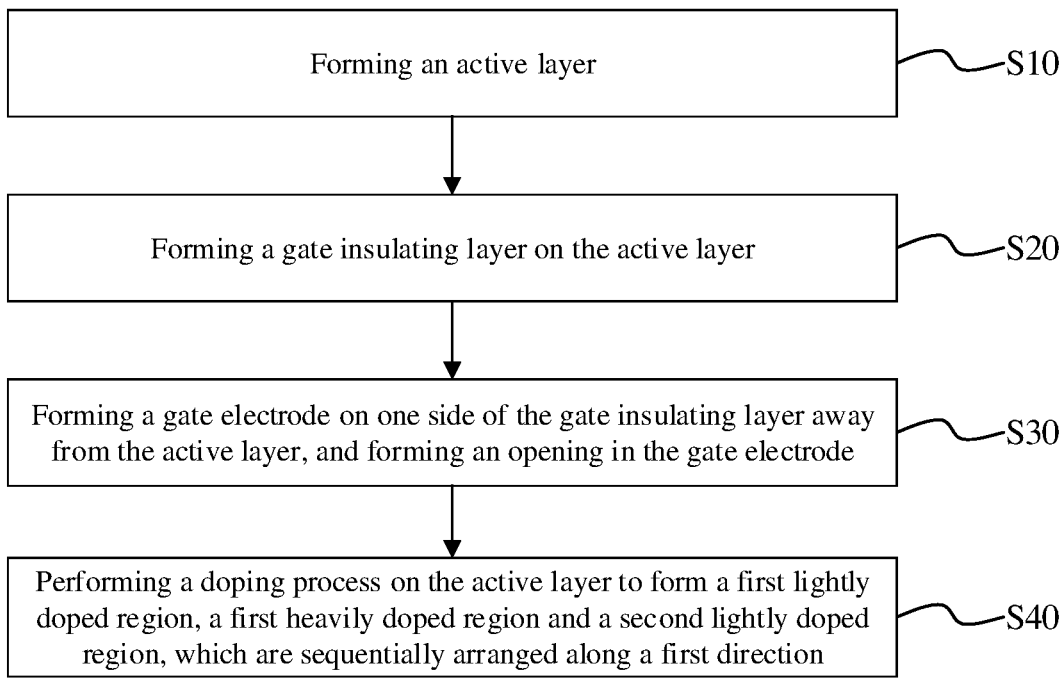
FIG. 7 is a flowchart of a manufacturing method of a thin film transistor according to an embodiment of the present disclosure.

An embodiment of the present disclosure further provides a manufacturing method of a thin film transistor. FIG. 7 is a flowchart of the manufacturing method of the thin film transistor, and FIGS. 8A-8D are cross-sectional views of processes of the manufacturing method of the thin film transistor. As illustrated in FIG. 7 and FIGS. 8A-8D, the manufacturing method includes steps S10-S40.

Figure 8A:
FIGS. 8A-8D are cross-sectional views of processes of a manufacturing method of a thin film transistor according to an embodiment of the present disclosure.

S10, forming an active layer 100, as illustrated in FIG. 8A.

For example, the method of forming the active layer 100 includes: cleaning a base substrate, forming an amorphous silicon film (a-Si) by chemical vapor deposition (CVD), and performing an excimer laser annealing (ELA) process on the amorphous silicon film to convert the amorphous silicon film into a poly-silicon film (p-Si), and patterning the poly-silicon thin film to form an active layer consisting of a plurality of mutually independent silicon islands. It should be noted that in FIG. 8A, only one silicon island of the active layer is exemplified, but the active layer 100 includes a plurality of silicon islands, and FIGS. 8B-8D in the following are the same in this aspect.

In some examples, the channel region of the thin film transistor is a doped region. In this case, the method of forming the active layer further includes: performing a pre-doping process on the whole region of the active layer to form an N-type doped active layer or a P-type doped active layer. For example, the pre-doping process can adopt an in-situ doping method, that is, while forming an amorphous silicon film, the amorphous silicon film is doped, then the doped amorphous silicon film is converted into a poly-silicon film, and the poly-silicon film is patterned to form an active layer; alternatively, the pre-doping process can also dope the poly-silicon film after the poly-silicon film is formed; alternatively, the pre-doping process can dope the active layer after the active layer is formed. For example, the pre-doping process is a lightly doping process. Of course, for the thin film transistor with an undoped channel region, the method of forming the active layer may not include this step.

Figure 8B:
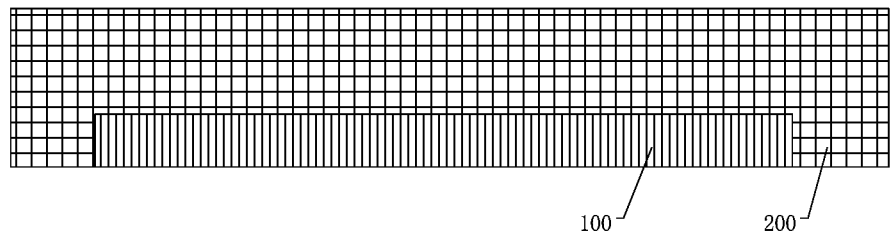

S20, forming a gate insulating layer 200 on the active layer 100, as illustrated in FIG. 8B.

For example, the gate insulating layer is formed on the poly-silicon film by CVD, and the material of the gate insulating layer is, for example, $SiN_x$.

Figure 8C:
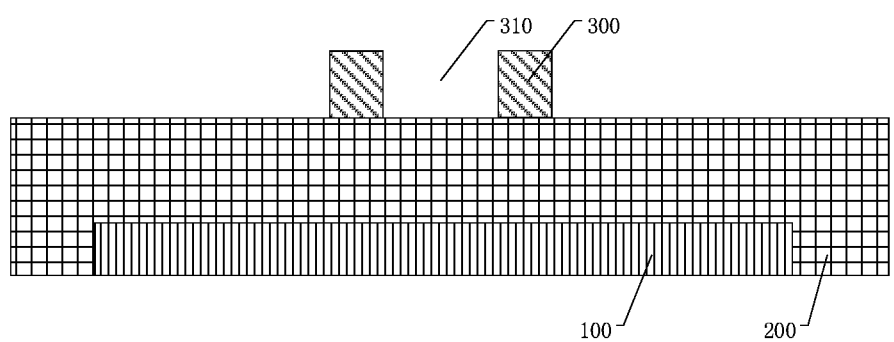

S30, forming a gate electrode 300 on one side of the gate insulating layer 200 away from the active layer 100, and forming an opening 310 in the gate electrode 300, as illustrated in FIG. 8C.

For example, the gate electrode is formed on the gate insulating layer by using a sputtering process. The material of the gate electrode can be a metal, such as WSi, TaN, MoTa, Cr, Al, etc., or other conductive material.

Figure 8D:
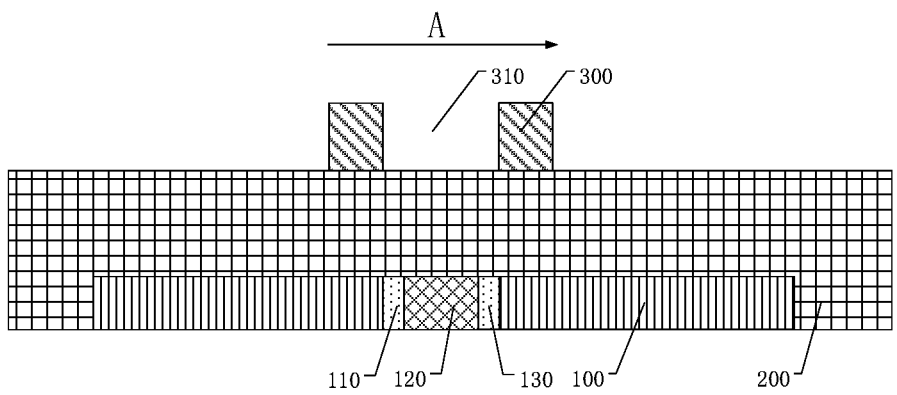

S40: performing a re-doping process on the active layer 100 to form a first lightly doped region 110, a first heavily doped region 120 and a second lightly doped region 130, which are sequentially arranged along a first direction A parallel to the plane where the active layer 100 is located, as illustrated in FIG. 8D.

For example, for the thin film transistors with a doped channel region, the active layer has been pre-doped. In this case, the doping type of the re-doping process is opposite to that of the pre-doping process. For example, if the pre-doping is N-type doping, the re-doping is P-type doping; or, if the pre-doping is P-type doping, the re-doping is N-type doping.

Figure 9:
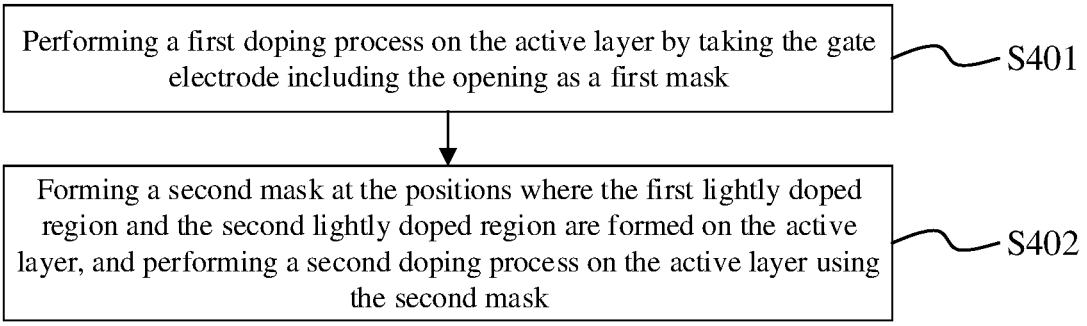
FIG. 9 is a flowchart of performing a re-doping process on an active layer according to an embodiment of the present disclosure.

FIG. 9 is a flow chart of performing a re-doping process on an active layer. As illustrated in FIG. 9, in step S40, performing the re-doping process on the active layer includes:

S401: performing a first doping process on the active layer by taking the gate electrode including the opening as a first mask; and S402: forming a second mask at the positions where the first lightly doped region and the second lightly doped region are formed on the active layer, and performing a second doping process on the active layer using the second mask. The first doping process is a lightly doping process, the second doping process is a heavily doping process, and the doping concentration of the first doping process is lower than that of the second doping process, thereby forming the first lightly doped region, the second lightly doped region and the first heavily doped region.

For example, for the thin film transistor with a doped channel region, the active layer has been pre-doped. In this case, the doping types of the first doping process and the second doping process are opposite to the doping type of the pre-doping process, and the doping types of the first lightly doped region, the second lightly doped region and the first heavily doped region formed by the first doping process and the second doping process are opposite to the doping type of the active layer formed by the pre-doping process. Because the first doping process needs to neutralize the ions in the active layer after the pre-doping process, it needs a higher ion concentration than the pre-doping process. That is to say, the first doping process firstly needs to reverse the conductivity type of the lightly doped region, and then continue doping to form the lightly doped region with the doping type opposite to that of the channel region. However, this does not mean that the doping concentration of the finally formed lightly doped region is higher than the doping concentration of the channel region. For example, the doping concentration of the lightly doped region can be approximately equal to the doping concentration of the channel region, and the conductivity types of them can be opposite to each other.

The manufacturing method of the thin film transistor provided by the above embodiment will be further described below by taking the thin film transistor illustrated in FIG. 5 and FIG. 6 as an example.

For the thin film transistor illustrated in FIG. 5 and FIG. 6, in the above step S401, the first doping process is performed on the active layer 100 by taking the gate electrode 300 including the opening 310 as the first mask, so as to form a third lightly doped region 140 and a fourth lightly doped region 150, and the third lightly doped region 140 and the fourth lightly doped region 150 are respectively located at the two sides of the gate electrode 300 along the first direction A and adjacent to the gate electrode 300.

For the thin film transistors illustrated in FIG. 5 and FIG. 6, the second mask is not only located at the positions corresponding to the first lightly doped region 110 and the second lightly doped region 130, but also at the positions corresponding to the third lightly doped region 140 and the fourth lightly doped region. In this way, while forming the first heavily doped region 120, a second heavily doped region 160 is formed at one side of the third lightly doped region 140 away from the gate electrode 300 along the first direction A, and a third heavily doped region 170 is formed at one side of the fourth lightly doped region 150 away from the gate electrode 300 along the first direction A.

For example, the manufacturing method of the thin film transistor provided by the embodiment of the present disclosure further includes: forming a buffer layer on the base substrate before forming the active layer; forming an interlayer insulating layer on the gate electrode; forming via holes in the interlayer insulating layer and the gate insulating layer; forming a source electrode and a drain electrode on the interlayer insulating layer, wherein the source electrode and the drain electrode are respectively electrically connected to the second heavily doped region and the third heavily doped region of the active layer through the via holes; and other processing steps, which are not redundantly described here.

The manufacturing method of the thin film transistor provided by the embodiment of the present disclosure can be used to manufacture the thin film transistor provided by any one of the above embodiments, and has the same technical effects as the above thin film transistor, which will not be redundantly described here.

The following statements should be noted:
(1) The accompanying drawings involve only the structure(s) in connection with the embodiment(s) of the present disclosure, and other structure(s) can be referred to common design(s).
(2) In case of no conflict, features in one embodiment or in different embodiments can be combined.

What have been described above are only specific implementations of the present disclosure, the protection scope of the present disclosure is not limited thereto. Any changes or substitutions easily occur to those skilled in the art within the technical scope of the present disclosure should be covered in the protection scope of the present disclosure. Therefore, the protection scope of the present disclosure should be based on the protection scope of the claims.

What is claimed is:

1. A thin film transistor, comprising:
an active layer;
a gate insulating layer at one side of the active layer;
a gate electrode at one side of the gate insulating layer away from the active layer,
wherein the gate electrode comprises an opening, and a part of the active layer overlapped with the opening comprises a first lightly doped region, a first heavily doped region and a second lightly doped region which are sequentially arranged in a first direction parallel to a plane where the active layer is located, and
wherein the opening comprises a first end portion and a second end portion in a second direction perpendicular to the first direction, the active layer comprises a first edge and a second edge in the second direction, the first edge is at one side of the active layer close to the first end portion, the second edge is at one side of the active layer close to the second end portion, the first end portion is located at an outer side of the first edge, and the second end portion is located at an outer side of the second edge.

2. The thin film transistor according to claim 1, wherein in the first direction, parts of the active layer located at two sides of the gate electrode and adjacent to the gate electrode respectively comprise a third lightly doped region and a fourth lightly doped region, and further comprises a second heavily doped region at one side of the third lightly doped region away from the gate electrode and a third heavily doped region at one side of the fourth lightly doped region away from the gate electrode,
the second heavily doped region and the third heavily doped region are respectively a source region and a drain region of the thin film transistor.

3. The thin film transistor according to claim 2, further comprising a source electrode and a drain electrode, respectively electrically connected to the source region and the drain region.

4. The thin film transistor according to claim 2, wherein the first lightly doped region, the second lightly doped region, the third lightly doped region, the fourth lightly doped region, the first heavily doped region, the second heavily doped region and the third heavily doped region have a same doping type.

5. The thin film transistor according to claim 4, wherein a doping concentration of each of the first heavily doped region, the second heavily doped region and the third heavily doped region is 4-25 times a doping concentration of each of the first lightly doped region, the second lightly doped region, the third lightly doped region and the fourth lightly doped region.

6. The thin film transistor according to claim 4, wherein a part of the active layer overlapped with the gate electrode is a channel region, and a doping type of the channel region is opposite to the doping type of the first lightly doped region.

7. The thin film transistor according to claim 6, wherein the channel region comprises a first channel region and a second channel region at two sides of the opening in the first direction; and in the first direction, the second heavily doped region, the third lightly doped region, the first channel region, the first lightly doped region, the first heavily doped region, the second lightly doped region, the second channel region, the fourth lightly doped region and the third heavily doped region are sequentially connected.

8. The thin film transistor according to claim 1, wherein the gate electrode has a stripe shape extending in the second direction.

9. The thin film transistor according to claim 1, wherein the active layer is a low-temperature poly-silicon semiconductor layer.

10. An array substrate, comprising the thin film transistor according to claim 1.

11. A display device, comprising the array substrate according to claim 10.

12. A manufacturing method of a thin film transistor, comprising:
    forming an active layer;
    forming a gate insulating layer on the active layer;
    forming a gate electrode on one side of the gate insulating layer away from the active layer, and forming an opening in the gate electrode; and
    performing a doping process on the active layer to form a first lightly doped region, a first heavily doped region and a second lightly doped region, which are sequentially arranged in a direction parallel to a plane where the active layer is located, in a part of the active layer overlapped with the opening,
    wherein the opening comprises a first tend portion and a second end portion in a second direction perpendicular to the first direction, the active layer comprises a first edge and a second edge in the second direction, the first edge is at one side of the active, layer close to the first end portion, the second edge is at one side of the active layer close to the second end portion, the first edge is aligned with the first edge or located at an outer side of the first edge, and the second end portion is aligned with the second edge or located at an outer side of the second edge.

13. The method according to claim 12, wherein performing a doping process on the active layer comprises:
    performing a first doping process on the active layer by taking the gate electrode with the opening as a first mask; and
    forming a second mask at positions where the first lightly doped region and the second lightly doped region are formed on the active layer, and performing a second doping process,
    wherein a doping concentration of the first doping process is lower than a doping concentration of the second doping process, so as to form the first lightly doped region, the second lightly doped region and the first heavily doped region.

14. The method according to claim 13, wherein
    upon performing the first doping process on the active layer by taking the gate electrode with the opening as the first mask, a third lightly doped region and a fourth lightly doped region are further formed, wherein the third lightly doped region and the fourth lightly doped region are respectively at two sides of the gate electrode in the direction and adjacent to the gate electrode;
    the second mask is also located at the third lightly doped region and the fourth lightly doped region, and upon forming the first heavily doped region, a second heavily doped region is formed at one side of the third lightly doped region away from the gate electrode, and a third heavily doped region is formed at one side of the fourth lightly doped region away from the gate electrode.

15. The method according to claim 13, further comprising:
    performing a third doping process on the active layer before the first doping process, wherein a doping type of the third doping process is opposite to doping types of the first doping process and the second doping process.

* * * * *